(12) United States Patent
Chen et al.

(10) Patent No.: US 7,230,331 B2
(45) Date of Patent: Jun. 12, 2007

(54) CHIP PACKAGE STRUCTURE AND PROCESS FOR FABRICATING THE SAME

(75) Inventors: Kai-Chi Chen, Nantou County (TW); Shu-Chen Huang, Keelung (TW); Hsun-Tien Li, Hsinchu (TW); Tzong-Ming Lee, Hsinchu (TW); Taro Fukui, Osaka (JP); Tomoaki Nemoto, Osaka (JP)

(73) Assignees: Industrial Technology Research Institute, Hsinchu (TW); Matsushita Electric Works, Ltd., Osaka (JP)

( * ) Notice: Subject to any disclaimer, the term of this patent is extended or adjusted under 35 U.S.C. 154(b) by 151 days.

(21) Appl. No.: 10/707,683

(22) Filed: Jan. 5, 2004

(65) Prior Publication Data

US 2005/0087852 A1 Apr. 28, 2005

(30) Foreign Application Priority Data

Apr. 22, 2003 (JP) .............................. 2003-117506
Oct. 24, 2003 (TW) .............................. 92129523 A

(51) Int. Cl.
*H01L 23/22* (2006.01)
*H01L 23/48* (2006.01)
*H01L 23/52* (2006.01)
*H01L 29/40* (2006.01)

(52) U.S. Cl. ...................... 257/687; 257/778; 257/787; 257/E23.124

(58) Field of Classification Search ................. 257/687
See application file for complete search history.

(56) References Cited

U.S. PATENT DOCUMENTS 6,339,254 B1 * 1/2002 Venkateshwaran et al. . 257/686
2003/0183946 A1 * 10/2003 Fukuda et al. .............. 257/778

* cited by examiner

*Primary Examiner*—David A. Zarneke
(74) *Attorney, Agent, or Firm*—Jianq Chyun IP Office

(57) ABSTRACT

A chip package structure and a process for fabricating the same is disclosed. The chip package structure mainly comprises a carrier, a chip and an encapsulating material layer. To fabricate the chip package, a carrier and a plurality of chips are provided. Each chip has at least an active surface with a plurality of bumps thereon. The chips and the carrier are electrically connected. An encapsulating material layer that fills the bonding gap between the chips and the carriers and covers the chips and carrier is formed. The encapsulating material layer between the chips and the carrier has a first thickness and the encapsulating material layer over the chips has a second thickness. The second thickness has a value between half to twice the first thickness.

5 Claims, 5 Drawing Sheets

|  | Examples 1, 6, 7 and contrast examples 1, 5 | Contrast example 2 | Example 2 |
|---|---|---|---|
| Molding Temperature | 170°C | 170°C | 170°C |
| Degree of Vacuum | 1 mmHg | Atmospheric Pressure | 15 mmHg |
| Encapsulating Material Category (Silica) *1 | A | A | A |

|  | Example 3 | Example 4 | Example 5 | Contrast example 3 | Contrast example 4 |
|---|---|---|---|---|---|
| Molding Temperature | 170°C | 160°C | 180°C | 170°C | 170°C |
| Degree of Vacuum | 80 mmHg | 1 mmHg | 1 mmHg | 1 mmHg | 1 mmHg |
| Encapsulating Material Category (Silica) *1 | A | A | A | B | C |

*1 Encapsulating material A: average particle diameter 5μm
maximum particle diameter 21μm Encapsulating material B: average particle diameter 13μm
maximum particle diameter 40μm Encapsulating material C: average particle diameter 13μm
maximum particle diameter 74μm

FIG. 8

|  | Example 1 | Contrast example 1 | Contrast example 2 | Example 6 | Contrast example 4 | Contrast example 3 | Example 2 | Example 3 | Example 4 |
|---|---|---|---|---|---|---|---|---|---|
| Over mold layer thickness (mm) | 0.13 | 0.13 | 0.13 | 0.05 | 0.13 | 0.13 | 0.13 | 0.13 | 0.13 |
| Index *2 | 1.8 | 1.8 | 1.8 | 0.7 | 1.8 | 1.8 | 1.8 | 1.8 | 1.8 |

|  | Example 5 | Contrast example 3 | Contrast example 4 | Example 5 | Contrast example 5 | Contrast example 6 | Example 7 |
|---|---|---|---|---|---|---|---|
| Over mold layer thickness (mm) | 0.13 | 0.13 | 0.13 | 0.03 | 0.28 | | 0.12 |
| Index *2 | 1.8 | 1.8 | 1.8 | 0.4 | 3.9 | | 1.5 |

*2 over mold layer thickness/flip-chip bonding gap

FIG. 9

|  | Example 1 | Contrast example 3 | Contrast example 1 | Contrast example 2 | Example 2 | Example 3 | Example 4 |
|---|---|---|---|---|---|---|---|
| Package thickness *3 (mm) | 0.7 | 0.7 | 0.7 | 0.7 | 0.7 | 0.7 | 0.7 |
| Flip-chip bonding gap filling capacity *4 | 100% | 100% | 30% | 15% | 99% | 97% | 100% |
| Over mold layer filling capacity *5 | 100% | 100% | 50% | 40% | 95% | 90% | 100% |
| Solder persistence *5 | ▲ | O | X | X | O | O | ▲ |
| Temperature recycle reliability *6 | 2000 cycles | 500 cycles | -- | -- | 2000 cycles | 2000 cycles | 2000 cycles |
| Reliability *7 | >500 hours | 168 hours | -- | -- | >500 hours | >500hour | >500 hours |
| Others | | | | | | | |

|  | Example 5 | Contrast example 3 | Contrast example 4 | Example 6 | Contrast example 5 | Contrast example 6 | Example 7 |
|---|---|---|---|---|---|---|---|
| Package thickness *3 (mm) | 0.7 | 0.7 | 0.7 | 0.62 | 0.6 | 0.85 | 0.8 |
| Flip-chip bonding gap filling capacity *4 | 100% | 40% | 30% | 100% | 100% | 100% | 97% |
| Over mold layer filling capacity *5 | 100% | 70% | 50% | 100% | 60% | 100% | 100% |
| Solder persistence *5 | ▲ | X | X | ▲ | ▲ | ▲ | ▲ |
| Temperature recycle reliability *6 | 2000 cycles | -- | -- | 2000 cycles | 2000 cycles | 2000 cycles | 2000 cycles |
| Reliability *7 | >500 hours | -- | -- | >500 hours | >500 hours | >500 hours | 500 hours |
| Others | @ | | | | | | |

*3 measured package substrate thickness + Mold seal thickness
*4 relative to chip area, material filling area ratio (filling capacity) average value
over mold filling capacity visually inspected , detached from the substrate thereafter
material filling capacity of the flip-chip bonding gap also eye inspected
*5 solder persistence: ▲ : JEDEC level II passed; O: JEDEC level III passed;
(n = 11) X: JEDEC level III failed
*6 temperature recycle reliability: gaseous surrounding, 65°C/15min ~ 150°C/15min
(n = 11)
*7 PCT reliability 121°C/2atms
@ assessed using a total of 32 molded devices, 2 defective devices/remaining non-defective devices

FIG.10

CHIP PACKAGE STRUCTURE AND PROCESS FOR FABRICATING THE SAME

CROSS REFERENCE TO RELATED APPLICATIONS

This application claims the priority benefit of Japan application serial no. 2003-117506, filed Apr. 22, 2003 and Taiwan application serial no. 92129523, filed Oct. 24, 2003.

BACKGROUND OF INVENTION

1. Field of the Invention

The present invention relates to a chip package structure and process of fabricating the same. More particularly, the present invention relates to an ultra-thin chip package structure for mobile communication and process of fabricating the same.

2. Description of the Related Art

In this fast and ever-changing society, information matters to all people. Many types of portable electronic devices are produced with an attempt to catch up with our desires to transmit and receive more data. Due to this trend, manufacturers have tried hard to factor into their chip package as many design concepts as possible including digital layout, network organization, local area connection and personalized of electronic devices. To do so demands special consideration in every aspect of the design process that affects the processing speed, multifunctional capability, integration level, weight and cost of the chip package. In other words, chip packages must be miniaturized and densified. Flip chip (F/C) bonding technique, through the bonding of bumps to a carrier, is currently one of the principle means of reducing overall wiring length over the conventional wire-bonding method. With a shortening of wiring length in a F/C package, signal transmission rate between the chip and a carrier is increased. Thus, F/C packaging technique is one of the most popular techniques for forming high-density packages.

FIG. 1 is a schematic cross-sectional view of a chip package structure fabricated through a conventional flip-chip packaging technique. As shown in FIG. 1, the chip package structure 10 mainly comprises a chip 50, a carrier 80 and an encapsulating material layer 70. The chip 50 has an active surface 52 with a plurality of bonding pads (not shown) thereon. The carrier 80 also has a plurality of contact pads (not shown) thereon. A plurality of bumps 60 is positioned on the respective bonding pads on the active surface 52 of the chip 50. Furthermore, the bonding pads on the chip 50 and the contact pads on the carrier 80 are electrically connected together through the bumps 60. On the far side of the carrier 80 away from the chip 50, an array of solder balls 90 is attached. In other words, the chip package structure 10 has a ball grid array (BGA) packaging structure for connecting electrically with a printed circuit board (PCB).

To prevent any damage to the chip 50 due to an incursion of moisture and any damage to the bumps 60 due to mechanical stress, an encapsulating material layer 70 is formed in the bonding gap between the chip 50 and the carrier 80. Conventionally, the encapsulating material layer 70 is formed by channeling a liquid encapsulating material with low viscosity into the bonding gap between the chip 50 and the carrier 80 through capillary effect and then curing the injected material afterwards.

As mentioned before, the flip-chip package structure 10 as shown in FIG. 1 has an electrical performance better than the conventional wire-bonded chip package. Furthermore, the flip-chip package structure 10 has an ultra-thin thickness suitable for inserting inside a mobile communication device. However, it takes considerable time to fill up all the interior space between the chip 50 and the carrier 80 with liquid encapsulating material through capillary effect alone. Hence, this method is not particularly suitable for economic mass production. Moreover, the number of bumps 60, the distribution of the bumps 60 inside the package as well as the distance of separation between the flip chip 50 and the carrier 80 are principal factors affecting the flow of liquid encapsulating material. Because the capillary effect is utilized to draw liquid encapsulating material into the space between the chip 50 and the carrier 80, any variation of the liquid flow conditions is likely to hinder the filling process leading to a possibility of formation of voids therein. In other words, reliability of the package will be affected.

In addition, the chip 50 is directly exposed. Hence, the chip 50 is easily damaged when special markings are engraved on the surface of the chip 50 or the chip package structure 10 is picked up using a suction grip at the end of a robotic arm. To avoid these defects, an alternative chip package structure is provided. FIGS. 2A and 2B are cross-sectional views of alternative chip package structures fabricated through another conventional flip-chip packaging technique. As shown in FIG. 2A, an additional over mold layer 72 is formed over the chip package structure 10 in FIG. 1 to protect the chip 50 against possible damage.

However, the need to form an additional over mold layer 72 increases overall processing time resulting a drop in productivity. Moreover, delamination is a likely occurrence at the junction interface between the encapsulating material layer 70 and the over mold layer 72. In other words, overall reliability of the chip package structure 12 will drop.

To avoid delamination and increase productivity, an improved chip package structure 14 is shown in FIG. 2B. As shown in FIG. 2B, a simultaneous molding operation is carried out to form an encapsulating material layer 74 that covers the chip 50 as well as the carrier 80 and fills the bonding gap between the chip 50 and the carrier 80. Although the simultaneous molding process is able to prevent delamination, the encapsulating material layer 74 covering the chip must have a minimum thickness of about 0.2 cm to prevent an incomplete filling. With this design limitation, producing an ultra-thin package suitable for incorporating inside a mobile communication device is almost impossible.

SUMMARY OF INVENTION

Accordingly, one objective of the present invention is to provide an ultra-thin chip package structure and process of fabricating the same suitable for a high-density device and a fabrication process thereof that can increase the productivity and reliability of the chip package structure.

To achieve these and other advantages and in accordance with the purpose of the invention, as embodied and broadly described herein, the invention provides a chip package structure. The chip package structure mainly comprises a carrier, a chip and an encapsulating material layer. The chip has an active surface with a plurality of bumps thereon. The active surface of the chip is flipped over to face the carrier. Thereafter, the chip and the carrier are bonded and electrically connected together. The encapsulating material layer fills the bonding gap between the chip and the carrier as well as covers the chip and the carrier.

Furthermore, the encapsulating material layer filling between the chip and the carrier has a first thickness and the encapsulating material layer above the chip has a second thickness. The second thickness is between 0.5~2 times that of the first thickness.

This invention also provides an alternative chip package structure. The chip package structure mainly comprises a carrier, a chipset and an encapsulating material layer. The chipset is set over the carrier and is electrically connected to the carrier. The chipset comprises a plurality of chips with at least one chip bonded to the carrier or another chip as a flip-chip with a bonding gap. The encapsulating material layer completely fills the flip-chip bonding gap and covers the chipset as well as the carrier.

The encapsulating material layer filling within the flip-chip bonding gap has a first thickness and the encapsulating material layer above the chipset has a second thickness. The second thickness is between 0.5~2 times that of the first thickness.

Furthermore, in one embodiment of this invention, the chipset comprises a first chip and a second chip. The first chip has a first active surface. The first chip is set over the carrier such that the first active surface of the first chip is away from the carrier. The second chip has a second active surface with a plurality of bumps thereon. The second active surface of the second chip is flipped over to face the first chip. The second chip is bonded and electrically connected to the first chip. The flip-chip bonding gap is set through the bumps.

In addition, the chipset further comprises a plurality of conductive wires. The ends of each conductive wire are electrically connected to the first chip and the carrier respectively.

Alternatively, the chipset in this embodiment comprises a first chip, a second chip and a third chip. The first chip has a first active surface with a plurality of first bumps thereon. The first active surface of first chip is flipped over to face the carrier. Thereafter, the first chip is bonded and connected electrically to the carrier. The second chip has a second active surface. The second chip is set on the first chip such that the second active surface of the second chip is away from the first chip. The third chip has a third active surface with a plurality of second bumps thereon. The third active surface of third chip is flipped over to face the second chip. Thereafter, the third chip is bonded and connected electrically to the second chip. A flip-chip bonding gap is set through the first bumps as well as the second bumps.

The chipset further comprises a plurality of conductive wires. The ends of each conductive wire are electrically connected to the second chip and the carrier respectively.

In the aforementioned chip package structures, the maximum diameter of particles constituting the encapsulating material layer is smaller than 0.5 times the first thickness. The chip package structures may also include a plurality of solder balls and at least a passive component. The solder balls are set in the form of an array over a surface of the carrier having no attached chips. The passive component is set over and electrically connected to the carrier. The carrier is a package substrate or a lead frame, for example.

This invention also provides a process for fabricating a chip package structure. To fabricate the chip package structure, a carrier and a plurality of chips each having an active surface is provided. At least one of the chips has an active surface with a plurality of bumps thereon. Thereafter, the chips and the carrier are connected electrically. Finally, an encapsulating material layer is formed in the bonding gap between the chips and the carrier as well as over the chips and the carrier.

The encapsulating material layer filling between the chips and the carrier has a first thickness and the encapsulating material layer above the chips has a second thickness. The second thickness is between 0.5~2 times that of the first thickness.

Furthermore, the encapsulating material layer is formed by performing a reduced-pressure transfer molding process. After forming the encapsulating material layer, the carrier is singulated to form a plurality of chip package structures. The reduced-pressure transfer molding process is carried out at a pressure below 20 mm-Hg (Torr) and a temperature at least 10° C. lower than the melting point of the bumps. Moreover, maximum diameter of particles constituting the encapsulating material layer must be smaller than 0.5 times the first thickness.

In brief, the encapsulating material layer (that is, the over mold layer) in this invention covers the top surface of all chips. Hence, the chips inside the package are prevented from any direct contact during any marking or transport processes. In other words, damages to the chips inside the package are minimized. Furthermore, because the encapsulating material layer over and under the chips is formed in a simultaneous molding process, the production cycle is shortened and productivity is increased. Moreover, by optimizing the thickness of the over mold layer, reliability of the chip packaging process is ensured.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 8 is a table showing conditions and material properties for performing a transfer molding process.

FIG. 9 is a table showing thickness of the over mold layer (the measured results of section cutting) after a transfer molding process.

FIG. 10 is a table showing performance and reliability of chip packages after the transfer molding process.

DETAILED DESCRIPTION

Figure 1:
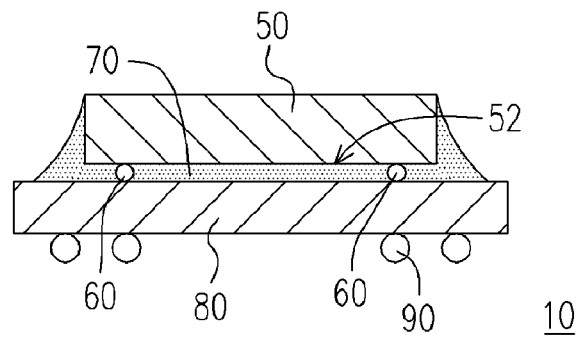
FIG. 1 is a schematic cross-sectional view of a chip package structure fabricated through a conventional flip-chip packaging technique.

Reference will now be made in detail to the present preferred embodiments of the invention, examples of which are illustrated in the accompanying drawings. Wherever possible, the same reference numbers are used in the drawings and the description to refer to the same or like parts.

Figure 3:
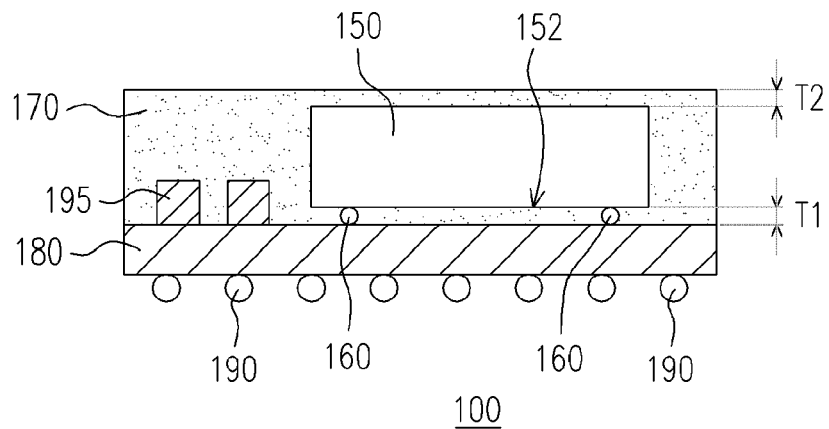
FIG. 3 is a schematic cross-sectional view of a chip package structure according to a first preferred embodiment of this invention.

FIG. 3 is a schematic cross-sectional view of a chip package structure according to a first preferred embodiment of this invention. As shown in FIG. 3, the chip package structure 100 mainly comprises a carrier 180, a chip 150 and an encapsulating material layer 170. The carrier 180 is, for example, an organic substrate, a ceramic substrate, a flexible substrate or a lead frame used in a flip-chip quad flat non-leaded packaging process. The carrier 180 has an upper and a lower surface with a plurality of contact pads (not shown) thereon.

The chip 150 has an active surface 152 with a plurality of bonding pads (not shown) thereon. A plurality of bumps 160 is attached to the bonding pads on the active surface 152 of the chip 150. The active surface 152 of the chip 150 is flipped over to face the carrier 180. Thereafter, the chip 150 is bonded to the carrier 180 through the bumps 160 on the bonding pads so that the chip 150 and the carrier 180 are electrically connected. In other words, the chip package structure 100 of this embodiment includes at least a chip 150 bonded to the upper surface of a carrier 180 using a flip-chip bonding technique. However, aside from the chip 150, this invention also permits the mounting of other chips or passive components such as resistors or capacitors on the carrier 180 within the package structure 100.

The encapsulating material layer 170 completely fills the bonding gap between the chip 150 and the carrier 180 and covers the chip 150 as well as the upper surface of the carrier 180.

The encapsulating material layer 170 filling within the bonding gap between the chip 150 and the carrier 180 has a first thickness T1 and the encapsulating material layer 170 above the chip 150 (the over mold layer) has a second thickness T2. In general, the second thickness T2 is between 0.5~2 times that of the first thickness T1.

The chip package structure 100 may also include a plurality of solder balls 190 and at least a passive component 195. The solder balls 190 are set in the form of an array on the contact pads at the lower surface of the carrier 180. The solder balls 190 are external electrical contacts for subsequent connection with a printed circuit board, for example. The passive component 195 is set on the upper surface of the carrier 180 and electrically connected to the carrier 180 as well.

Figure 2A:
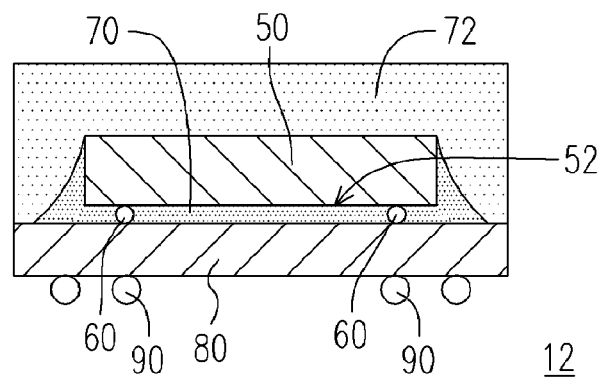
FIGS. 2A and 2B are cross-sectional views of alternative chip package structures fabricated through another conventional flip-chip packaging technique.
Figure 2B:
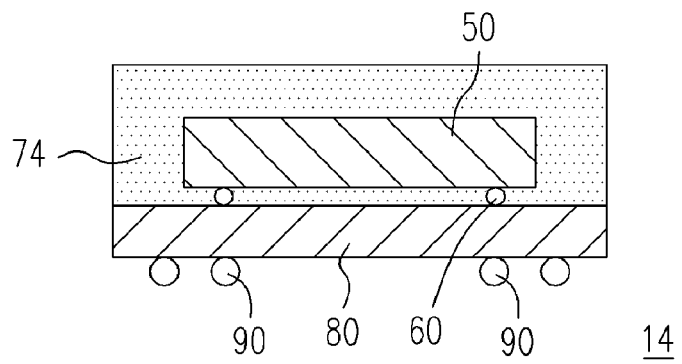

It is to be noted that the chip package structure 100 according to this invention differs from the conventional chip package structure in FIG. 2A in one major aspect, namely, the encapsulating material layer is formed in a simultaneous molding process. This prevents junction delamination resulting from performing multiple molding processes. In addition, maximum diameter of particles constituting the encapsulating material layer 170 is set to a value smaller than 0.5 times the first thickness T1.

Figure 4:
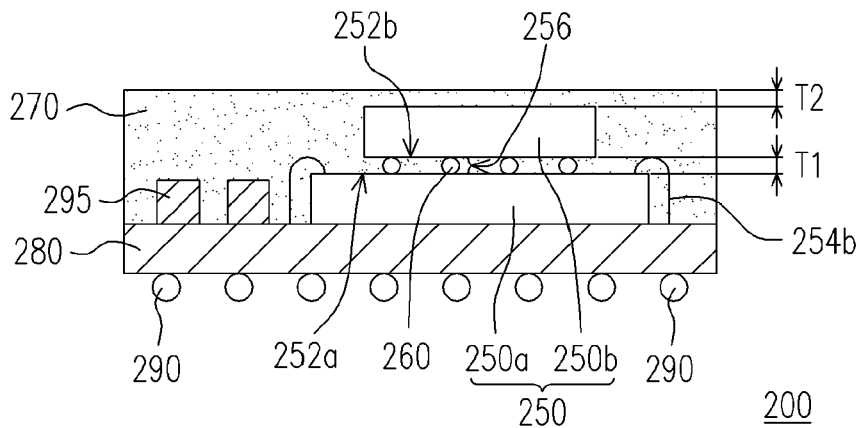
FIGS. 4 and 5 are schematic cross-sectional views of a chip package structure according to a second preferred embodiment of this invention.
Figure 5:
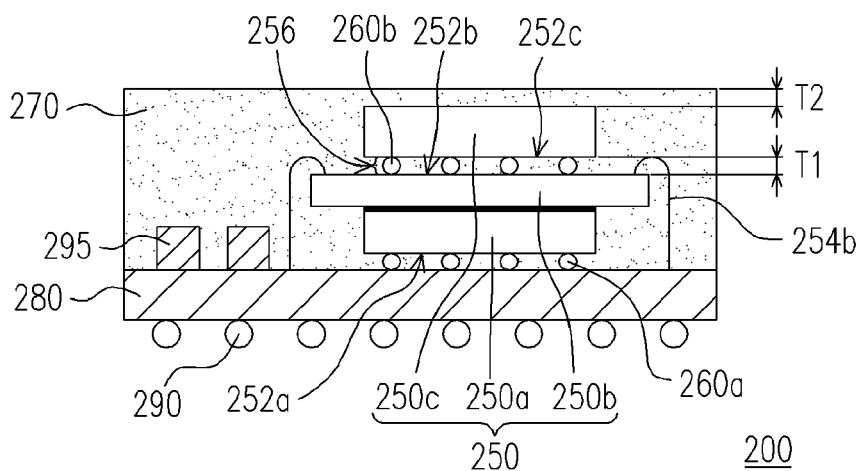

FIGS. 4 and 5 are schematic cross-sectional views of a chip package structure according to a second preferred embodiment of this invention. As shown in FIGS. 4 and 5, the chip package structure 200 mainly comprises a carrier 280, a chipset 250 and an encapsulating material layer 270.

The chipset 250 further comprises a plurality of chips. At least one of the chips is bonded to the carrier 280 or another chip using the flip-chip bonding technique. The chipset 250 at least includes a flip-chip bonding gap 256. The flip-chip bonding gap 256 is produced by the bumps supporting the flip-chip bonded chip. The encapsulating material layer 270 completely fills the flip-chip bonding gap 256 and covers the chipset 250 as well as the upper surface of the carrier 280.

The encapsulating material layer 270 within the flip-chip bonding gap 256 has a first thickness T1 and the encapsulating material layer 270 above the chipset 250 has a second thickness T2. In general, the second thickness T2 is between 0.5~2 times that of the first thickness T1.

As shown in FIG. 4, the chipset 250 comprises a first chip 250a and a second chip 250b. The first chip 250a has a first active surface 252a. The first chip 250a is set over the carrier 280 such that the first active surface 252a of the first chip 250a is away from the carrier 280. The second chip 250b has a second active surface 252b with a plurality of bumps 260 thereon. The second active surface 252b of the second chip 250b is flipped over to face the first chip 250a. The second chip 250b is bonded and electrically connected to the first chip 250a. The flip-chip bonding gap 256 is set through the bumps 260.

In addition, the chipset 250 further comprises a plurality of conductive wires 254b. The upper surface of the carrier 280 has a plurality of contact pads (not shown). Similarly, the first active surface 252a of the first chip 250a and the second active surface 252b of the second chip 250b has a plurality of bonding pads (not shown). The bumps 260 between the first chip 250a and the second chip 250b set the flip-chip bonding gap 256. In other words, the second chip 250b is bonded to the first active surface 252a of the first chip 250a using the flip-chip bonding technique. The ends of each conductive wire 254b are electrically connected to a bonding pad on the first chip 250a and a corresponding contact pad on the carrier 280.

As shown in FIG. 5, the chipset 250 in this embodiment comprises a first chip 250a, a second chip 250b and a third chip 250c. The chipset 250 further includes a plurality of conductive wires 254b. The first chip 250a is set on the carrier 280. The first chip 250a has a first active surface 252a with a plurality of first bumps 260a thereon. The first chip 250a is flipped over so that the first active surface 252a faces the carrier 280. Thereafter, the first chip 250a is bonded and connected electrically to the carrier 280. The second chip 250b has a second active surface 252b. The second chip 252b is set on the first chip 250a such that the second active surface 252b of the second chip 250b is away from the first chip 250a. Furthermore, the conductive wires 254b connect the bonding pads on the second active surface 252b of the second chip 250b with corresponding contact pads on the carrier 280 so that the second chip 250b and the carrier 280 are electrically connected. The third chip 250c has a third active surface 252c with a plurality of second bumps 260b thereon. The third chip 250c is flipped over such that the third active surface 252c of the third chip 250c faces the second chip 250b. Thereafter, the third chip 250c is bonded and connected electrically to the second chip 250b. A flip-chip bonding gap is set through the first bumps 260a as well as the second bumps 260b. In other words, the third chip 250c is bonded to the second active surface 252b of the second chip 250b using the flip-chip bonding technique. Similarly, the first chip 250a is bonded to the carrier 280 using the flip-chip bonding technique.

In this embodiment, the chip package structure has two flip-chip bonding gaps. Therefore, to fit in with the spirit and scope of this invention, thickness of the encapsulating material layer over the chipset should be controlled within a value larger than 0.5 times the smaller flip-chip bonding gap but smaller than 2 times the larger flip-chip bonding gap.

In the second embodiment, the number of chips within the chip package is increased. In addition, not all the chips have to be bonded to the carrier using the flip-chip bonding technique. In fact, the main characteristic of this invention is that the chip packages has at least a chip and the chip is bonded to a carrier or another chip using the flip-chip bonding technique. Furthermore, thickness of the encapsulating material layer over the chip is between 0.5~2 times the thickness of the flip-chip bonding gap. Any design with the aforementioned characteristics should be within the scope of this invention.

This invention also provides a process for fabricating the aforementioned chip packages structure. To fabricate the chip package structure, a carrier and a plurality of chips each having an active surface is provided. At least one of the chips has an active surface with a plurality of bumps thereon. Thereafter, the chips and the carrier are electrically connected. Finally, an encapsulating material layer is formed within the bonding gap between the chips and the carrier as well as over the chips and the carrier.

Figure 6A:
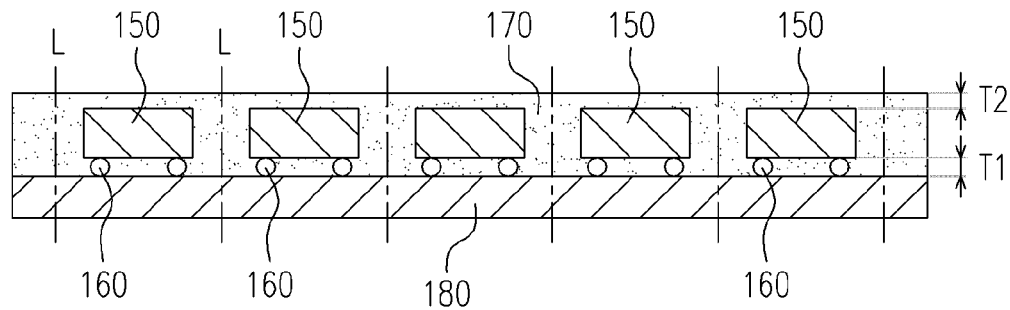
FIG. 6A is a schematic cross-sectional view of a finished product fabricated according to a chip package fabrication process according to this invention.

FIG. 6A is a schematic cross-sectional view of a finished product fabricated according to a chip package fabrication process according to this invention. As shown in FIG. 6A, the encapsulating material layer 170 between the chip 150 and the carrier 180 has a thickness T1 and the encapsulating material layer 170 above the chip 150 has a second thickness T2. The second thickness T2 is set between 0.5~2 times the first thickness T1.

Figure 6B:
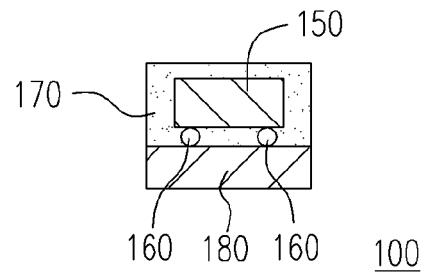
FIG. 6B is a schematic cross-sectional view of a singulated product fabricated according to a chip package fabrication process according to this invention.

FIG. 6B is a schematic cross-sectional view of a singulated product fabricated according to a chip package fabrication process according to this invention. To produce individual chip packages 100, the encapsulated semi-finished product as shown in FIG. 6A is cut along a series of cutting lines L. Each singulated chip package 100 at least comprises a chip 150. Although the encapsulating material layer 170 form a coherent mass, the mold for forming the encapsulating material layer 170 can be adjusted to form a plurality of independent encapsulating material layers 170. In other words, encapsulating material is prevented from entering the cutting zones so that the time for cutting out the chip packages is reduced.

It is to be noted that a reduced-pressure transfer molding process may be used to form the encapsulating material layer in the process of fabricating the chip package. In the reduced-pressure transfer molding process, the chips to be enclosed is placed inside a mold cavity. After reducing the pressure inside the mold cavity, encapsulant is channeled into the mold cavity. Thereafter, the mold is heated and pressurized so that the resin is cured. Ordinary transfer molding process has insufficient capacity for forming a fully filled encapsulating material layer in the flip-chip bonding gap or the over mold layer. On the other hand, if the pressure inside the mold cavity is allowed to lower to a level below 20 mm-Hg, the filling capability of the encapsulating material will improve considerably. Preferably, the mold cavity is set to a pressure below 10 mm-Hg.

Figure 7:
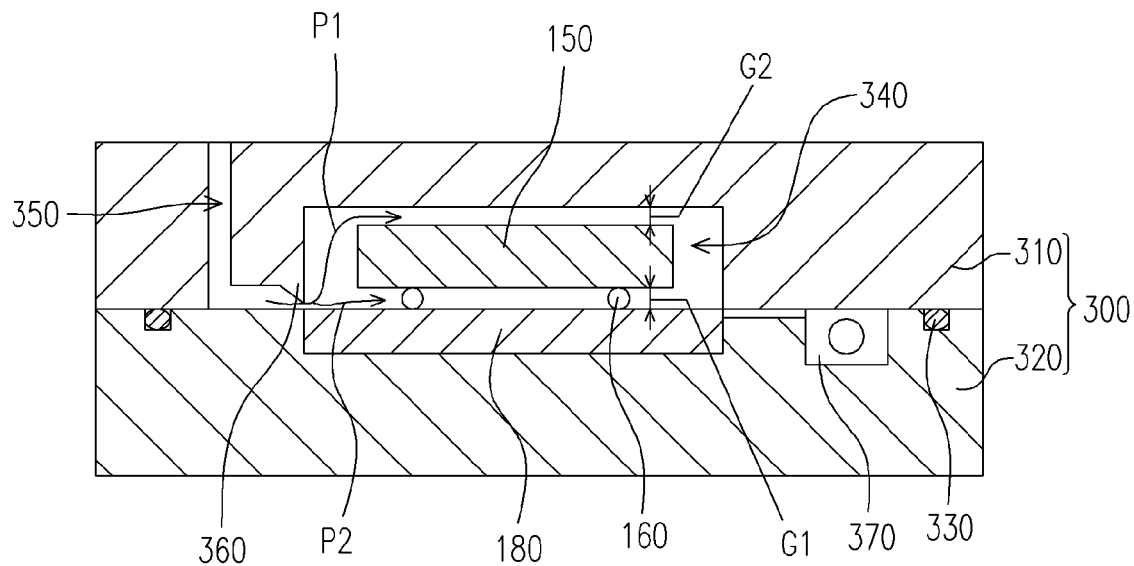
FIG. 7 is a schematic cross-sectional view showing a mold for forming the encapsulating material layer of a chip package in a reduced-pressure transfer molding process according to this invention.

FIG. 7 is a schematic cross-sectional view showing a mold for forming the encapsulating material layer of a chip package in a reduced-pressure transfer molding process according to this invention. As shown in FIG. 7, a mold 300 is placed inside a set of transfer molding equipment (not shown). The mold 300 comprises an upper mold section 310 and a lower mold section 320. To provide an effective vacuum when the upper mold 310 and the lower mold 320 are put together, the upper mold section 310, the lower mold section 320 and a vacuum rubber ring 330 inside the mold 300 are pressed to make a light contact. Air is drawn from a mold cavity 340 of the mold 300 using a vacuum pump (not shown) by way of a vacuum pipeline 370 so that the pressure inside the mold cavity 340 is reduced. Thereafter, plastic tablets (not shown) are deposited into a plastic injection pipeline 350 within the mold 300. Pumping continues for another 1~5 seconds to increase the degree of vacuum inside the mold cavity 340. In the meantime, the mold 300 is heated so that the plastic tablets melt to form a fluidic encapsulating material. Finally, the upper mold section 310 and the lower mold section 320 are tightly sealed and a plunger 360 is lifted to channel the melt encapsulating material into the mold cavity 340 via a first path P1 and a second path P2. This completes a reduced-pressure transfer molding process.

The first gap G1 above the chip 150 is 0.5~2 times the second gap G2 between the chip 150 and the carrier 180. During the reduced-pressure molding process, the mold is controlled at a temperature at least 10° C. below the melting point of the bumps 160. If temperature of the mold is higher than this value, the pressure generated by the melting encapsulating material may cause a delamination of the chip 150 when the bonding strength between the bumps 160 and the chip 150 is not strong enough.

Furthermore, if the first gap G1 above the chip 150 is smaller than 0.5 times the second gap G2, the molten encapsulating material will fill up the flip-chip gap first. Thereafter, a plug of material gathers at the opposite side of the plastic injection pipeline 350 to block the flow of encapsulating material over the chip 150. Hence, air will be trapped over the chip leading to the formation of an incomplete over mold layer. On the other hand, if the first gap G1 above the chip 150 is larger than 2 times the second gap G2, the molten encapsulating material will fill up the space above the chip 150 to form the over mold layer first. Thereafter, a plug of material gathers at the opposite side of the plastic injection pipeline 350 to block the flow of encapsulating material into the flip-chip bonding gap. Hence, air will be trapped inside the flip-chip bonding gap leading to the formation of an incomplete bonding gap layer. In both cases, reliability of the chip package will be compromised.

If lead-tin bumps are used inside the package, the flip-chip bonding gap is typically between 50~90 μm. When the flip-chip bonding gap is about 80 μm, for example, the over mold layer preferably has a thickness between 40~160 μm. However, if gold bumps are used, the flip-chip bonding gap is typically between 10~40 μm. When the flip-chip bonding gap is about 20 μm, for example, the over mold layer preferably has a thickness between 10~40 μm.

In addition, according to the chip packaging process of this invention, maximum diameter of particles constituting the encapsulating material is preferably smaller than 0.5 times the flip-chip bonding gap. If the encapsulating material contains particles with diameter greater than 0.5 times the flip-chip bonding gap, difficulties in filling the flip-chip gap or forming the over mold layer may be encountered.

If an ultra-thin chip package is all that is required, the chip package can be obtained by forming a chip package structure as shown in FIG. 2A and then grinding down the over mold layer. However, forming a chip package with an over mold layer between 40~160 μm similar to this invention using a conventional transfer molding process (a non pressure-reduced process) and conventional encapsulating material (having a maximum particle diameter exceeding 70 μm) is almost impossible. Moreover, some material layers within the chip package are likely to be incompletely filled.

The process of fabricating a chip package according to the preferred embodiment of this invention is based on a technique disclosed in a Japanese pattern JP392698 (2001). This invention aims at a further optimization of the package dimension so that the chip package can have optimal reliability.

In the following, actual examples and contrast examples of this invention as well as their application results are described.

EXAMPLE 1

Chips, each having a total area 8 mm×8 mm, 120 lead-tin bumps (melting point 183° C., pitch separation 0.25 mm) and a thickness 0.3 mm, are set in a 4×4 array over a carrier with an area 50 mm×50 mm, a thickness of 0.2 mm and fabricated from FR-5 material. After forming the encapsulating material layer, the carrier is singulated to form 10.5 mm×10.5 mm packages. The flip-chip bonding gap between the chip and the carrier is between 70~75 μm. A mold having a dimension 45 mm×45 mm×0.5 mm is used to carry out the mold injection process. A vacuum pump is used to reduce the pressure inside the mold cavity. Thereafter, a pressure of about 70 kgf/cm² is applied for 3 minutes during the transfer molding process to form the package as shown in FIG. 6A. A post-curing process is carried out at a temperature 175° C. for about 5 hours. The carrier in array format is singulated to form chip scale package (CSP) devices similar to the one shown in FIG. 3. Other conditions and material properties during the transfer molding process are listed out in FIG. 8 and remarks concerning the resulting device are listed out in FIGS. 9 and 10.

CONTRAST EXAMPLE 1

The same packaging substrate as in example 1 is used except that a conventional liquid underfill material (Matsushita Electric Works product CV5183F) is used to carry out the flip-chip bonding gap filling process. After curing the underfill material at prescribed conditions, a set of mold identical to the one in example 1 is used to form a semiconductor device as shown in FIG. 2A. Remarks concerning the device are listed out in FIGS. 9 and 10.

CONTRAST EXAMPLE 2

The same packaging substrate as in example 1 is used. Aside from not using a vacuum pump to reduce the pressure inside the mold cavity, the remaining processing steps are identical. A chip package structure identical to the one in FIG. 3 is formed. Remarks concerning the device are listed out in FIGS. 9 and 10.

EXAMPLE 2

Aside from changing the degree of depressurization in example 1 into the one listed in FIG. 8, all other processing steps are identical. A chip package structure identical to the one in FIG. 3 is formed. Remarks concerning the device are listed out in FIGS. 9 and 10.

EXAMPLE 3

Aside from changing the degree of depressurization in example 1 into the one listed in FIG. 8, all other processing steps are identical. A chip package structure identical to the one in FIG. 3 is formed. Remarks concerning the device are listed out in FIGS. 9 and 10.

EXAMPLE 4

Aside from changing the molding temperature in example 1 into the one listed in FIG. 8, all other processing steps are identical. A chip package structure identical to the one in FIG. 3 is formed. Remarks concerning the device are listed out in FIGS. 9 and 10.

EXAMPLE 5

Aside from changing the molding temperature in example 1 into the one listed in FIG. 8, all other processing steps are identical. A chip package structure identical to the one in FIG. 3 is formed. Remarks concerning the device are listed out in FIGS. 9 and 10.

CONTRAST EXAMPLE 3

Aside from changing the maximum diameter of encapsulating material particles in example 1 into the one listed in FIG. 8, all other processing steps are identical. A chip package structure identical to the one in FIG. 3 is formed. Remarks concerning the device are listed out in FIGS. 9 and 10.

CONTRAST EXAMPLE 4

Aside from changing the maximum diameter of encapsulating material particles in example 1 into the one listed in FIG. 8, all other processing steps are identical. A chip package structure identical to the one in FIG. 3 is formed. Remarks concerning the device are listed out in FIGS. 9 and 10.

EXAMPLE 6

Aside from changing the package thickness in example 1 from 0.5 mm to 0.42 mm, all other processing steps are identical. A chip package structure identical to the one in FIG. 3 is formed. Remarks concerning the device are listed out in FIGS. 9 and 10.

CONTRAST EXAMPLE 5

Aside from changing the package thickness in example 1 and 6 to 0.40 mm, all other processing steps are identical. A chip package structure identical to the one in FIG. 3 is formed. Remarks concerning the device are listed out in FIGS. 9 and 10.

CONTRAST EXAMPLE 6

Aside from changing the package thickness in example 1 and 6 to 0.65 mm, all other processing steps are identical. A chip package structure identical to the one in FIG. 3 is formed. Remarks concerning the device are listed out in FIGS. 9 and 10.

EXAMPLE 7

Chips, each having a total area 8 mm×8 mm, 800 lead-tin bumps (melting point 183° C., pitch separation 0.25 mm) and a thickness 0.2 mm, are set in an array over a carrier with an area 35 mm×35 mm, a thickness of 0.4 mm and fabricated from FR-5 material. The flip-chip bonding gap between the chip and the carrier is between 80~85 μm. A mold having a dimension 27 mm×27 mm×0.4 mm is used to carry out the mold injection process. The molding process is carried out with the same conditions described in Example 1 to produce ball grid array (BGA) flip-chip packages with an over mold layer. Remarks concerning the resulting device are listed out in FIGS. 9 and 10.

In summary, major advantages of the chip package structure and fabrication process thereof includes: 1. An encapsulating material layer covers the chips so that markings can be printed on the package and the package can be moved without damaging the chips. 2. The chip package is ultra-thin suitable for embedding inside a mobile device. 3. The encapsulating material layer can be void-free and hence has high reliability. 4. Molding cycle is shortened and hence productivity is increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

The invention claimed is:

1. A chip package structure, comprising;
   a carrier;
   a chip, having an active surface with a plurality of bumps thereon, wherein the active surface of the chip is bonded to the carrier using a flip-chip bonding technique so that the chip and the carrier are electrically connected; and
   an encapsulating material layer, covering the chip and the carrier and filling the bonding gap between the chip and the carrier, wherein the encapsulating material layer between the chip and the carrier has a first thickness and the encapsulating material layer on the chip has a second thickness such that the second thickness is between 0.5~2 times the first thickness,
   wherein the chip package structure has the only one chip therein and the chip is covered by the encapsulating material layer such that the chip in the chip package structure is enclosed by the encapsulating material layer.

2. The chip package structure of claim 1, wherein maximum diameter of particles constituting the encapsulating material layer is smaller than 0.5 times the first thickness.

3. The chip package structure of claim 1, wherein the package further comprises an array of solder balls attached to a surface of the carrier away from the chip.

4. The chip package structure of claim 1, wherein the package further comprises a passive component attached and electrically to the carrier.

5. The chip package structure of claim 1, wherein the carrier is selected from a group consisting of a package substrate and a lead frame.

* * * * *